(12) United States Patent
Mason et al.

(10) Patent No.: US 7,478,357 B1
(45) Date of Patent: Jan. 13, 2009

(54) VERSATILE BUS INTERFACE MACRO FOR DYNAMICALLY RECONFIGURABLE DESIGNS

(75) Inventors: Jeffrey M. Mason, Eldorado Springs, CO (US); W. Story Leavesley, III, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 22 days.

(21) Appl. No.: 11/503,589

(22) Filed: Aug. 14, 2006

(51) Int. Cl.
*G06F 17/50* (2006.01)

(52) U.S. Cl. .................. 716/16; 716/17; 716/1

(58) Field of Classification Search ............... 716/1–18
See application file for complete search history.

(56) References Cited

U.S. PATENT DOCUMENTS

| | | | |
|---|---|---|---|
| 5,453,706 | A | 9/1995 | Yee |
| 5,612,891 | A | 3/1997 | Butts et al. |
| 5,734,581 | A | 3/1998 | Butts et al. |
| 5,801,547 | A | 9/1998 | Kean |
| 6,020,758 | A | 2/2000 | Patel et al. |
| 6,023,421 | A | 2/2000 | Clinton et al. |
| 6,204,689 | B1 | 3/2001 | Percey et al. |
| 6,262,596 | B1 | 7/2001 | Schultz et al. |
| 6,462,579 | B1 | 10/2002 | Camilleri et al. |
| 6,798,239 | B2 * | 9/2004 | Douglass et al. ............... 326/39 |
| 7,024,651 | B1 | 4/2006 | Camilleri et al. |
| 7,058,919 | B1 * | 6/2006 | Young et al. .................. 716/12 |

OTHER PUBLICATIONS

U.S. Appl. No. 11/126,130, filed May 10, 2005, Becker et al.
U.S. Appl. No. 11/238,433, filed Aug. 28, 2005, Mason et al.
Xilinx, Inc.; "Virtex-4 User Gluide"; UG070 (v1.5); Mar. 21, 2006; Chapter 5; available from www.xilinx.com; pp. 163-185.
Xilinx Application Note: Virtex Series; XAPP151 (v1.5), "Virtex Series Configuration Architecture User Guide" Sep. 27, 2000; pp. 1-45; available from Xilinx, Inc. 2100 Logic Drive, San Jose, California 95124.
Xilinx Application Note; XAPP153 (v1.0), "Status and Control Semaphore Registers Using Partial Reconfiguration"; Jun. 7, 1999; pp. 1-4; available from Xilinx, Inc. 2100 Logic Drive, San Jose, California 95124.
U.S. Appl. No. 11/338,360, filed Jan. 24, 2006, Camilleri et al.

* cited by examiner

*Primary Examiner*—Sun J Lin
(74) *Attorney, Agent, or Firm*—Robert M. Brush

(57) ABSTRACT

Method and apparatus for module design in a PLD is described. In one example, a PLD includes a reconfigurable module, a static module, and at least one logic interface macro. The reconfigurable module includes a signal interface and is configured for active partial reconfiguration. The static module includes a signal interface. Each logic interface macro includes first pins coupled to the signal interface of the reconfigurable module and second pins coupled to the signal interface of the static module. The first pins and the second pins are disposed in an implementation area of the reconfigurable module. In one embodiment, each logic interface macro includes a slice of a configurable logic block (CLB). In some embodiments, each logic interface macro is implemented using another type of logic block, such as a block RAM and/or multiplier block.

17 Claims, 7 Drawing Sheets

VERSATILE BUS INTERFACE MACRO FOR DYNAMICALLY RECONFIGURABLE DESIGNS

FIELD OF THE INVENTION

One or more aspects of the present invention relate generally to electronic circuit design systems and, more particularly, to a versatile bus interface macro for dynamically reconfigurable designs for programmable logic devices.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, a final logic design (referenced herein as the top-level design) for a PLD may include many logic pieces (referenced herein as modules). All of the logic pieces may be implemented at one time to form a full implementation for the target PLD. Alternatively, each module may be designed and implemented separately. Implemented modules are then combined to form a full implementation for the target PLD. Some PLDs are configured to support dynamic reconfiguration while active. That is, some PLDs have the ability to reprogram a portion of the PLD while the rest of the PLD continues to operate normally. Since a portion of the device may be reconfigured while the device is active, some type of predefined macros or other entity must be used as interfaces to the reconfigurable modules. One such instantiation of this implementation uses three-state buffer (tbuf) macros as the interfaces of the reconfigurable modules. During reconfiguration, the tbuf macros allow a given module to be isolated from the portion of the design that is not being reconfigured. However, tbufs are typically a scarce resource in PLDs, which may restrict the number of reconfigurable modules that may be instantiated in any given design. Moreover, tbuf macros can only handle a fixed number of signals, which restricts the design of the interface of a given reconfigurable module. In addition, tbuf macros must be placed at the boundary of the reconfigurable modules, which also limits and restricts the design interface. Accordingly, there exists a need in the art for a versatile bus interface macro for dynamically reconfigurable designs for programmable logic devices.

SUMMARY OF THE INVENTION

A method and apparatus for module design in a PLD is described. In one embodiment, a PLD includes a reconfigurable module, a static module, and at least one logic interface macro. The reconfigurable module includes a signal interface and is configured for active partial reconfiguration. The static module includes a signal interface. Each logic interface macro includes first pins coupled to the signal interface of the reconfigurable module and second pins coupled to the signal interface of the static module. The first pins and the second pins are disposed in an implementation area of the reconfigurable module. In one embodiment, each logic interface macro includes a slice of a configurable logic block (CLB). In some embodiments, each logic interface macro is implemented using another type of logic block, such as a block RAM and/or multiplier block.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

A versatile bus interface macro for dynamically reconfigurable designs is described. In one embodiment, a logic interface macro includes a single configurable logic block (CLB) slice in a programmable logic device (PLD). The single slice interface macro may be placed anywhere within a reconfigurable module implementation area. The single slice interface macro defines a routing path between two implementation areas, which guarantees that the routing interface between implementation areas (e.g., static and dynamic regions) is fixed. The single slice interface macro improves upon other types of logic interface macros that must be placed along the boundary of the reconfigurable implementation area by allowing the use of more logic interface macros and more optimal placement of such macros. Aspects of the invention may be understood with reference to the following exemplary FPGA and CLB architectures described in FIGS. 1 and 2. Although these architectures are provided by way of example, those skilled in the art will appreciate that the invention may be used with other types of PLD and configurable logic block structures, e.g., block RAMs and/or multiplier blocks.

Figure 1:
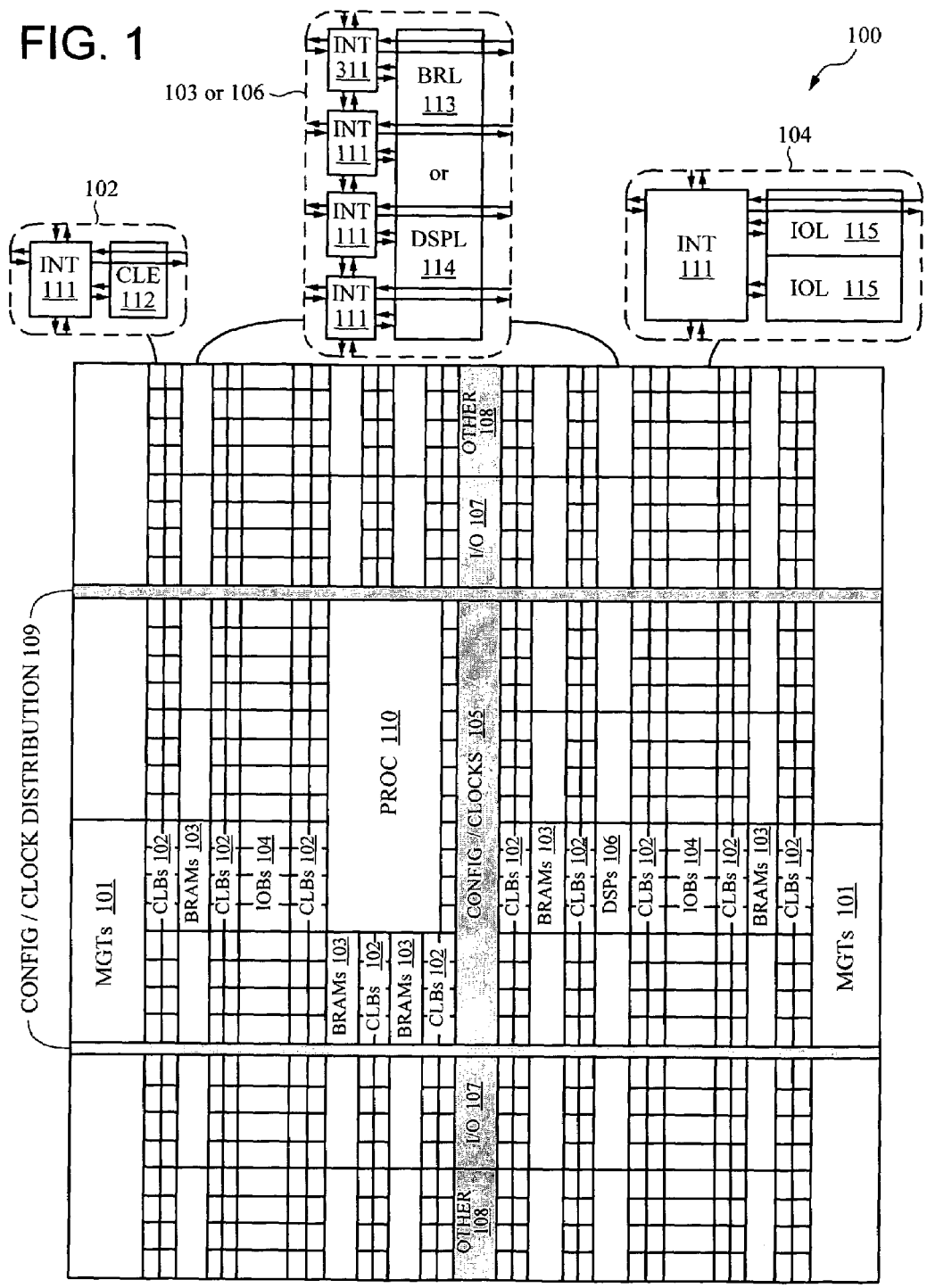
FIG. 1 illustrates an exemplary embodiment of an FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A CLE may include one or more "slices" of the CLB. Each slice in turn includes various circuits, such as flip-flops, function generators (e.g., look-up tables (LUTs), logic gates, memory, and like type well-known circuits. A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB tile 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The number of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. However, the number of adjacent CLB columns varies, e.g., with the size of the FPGA.

Figure 2:
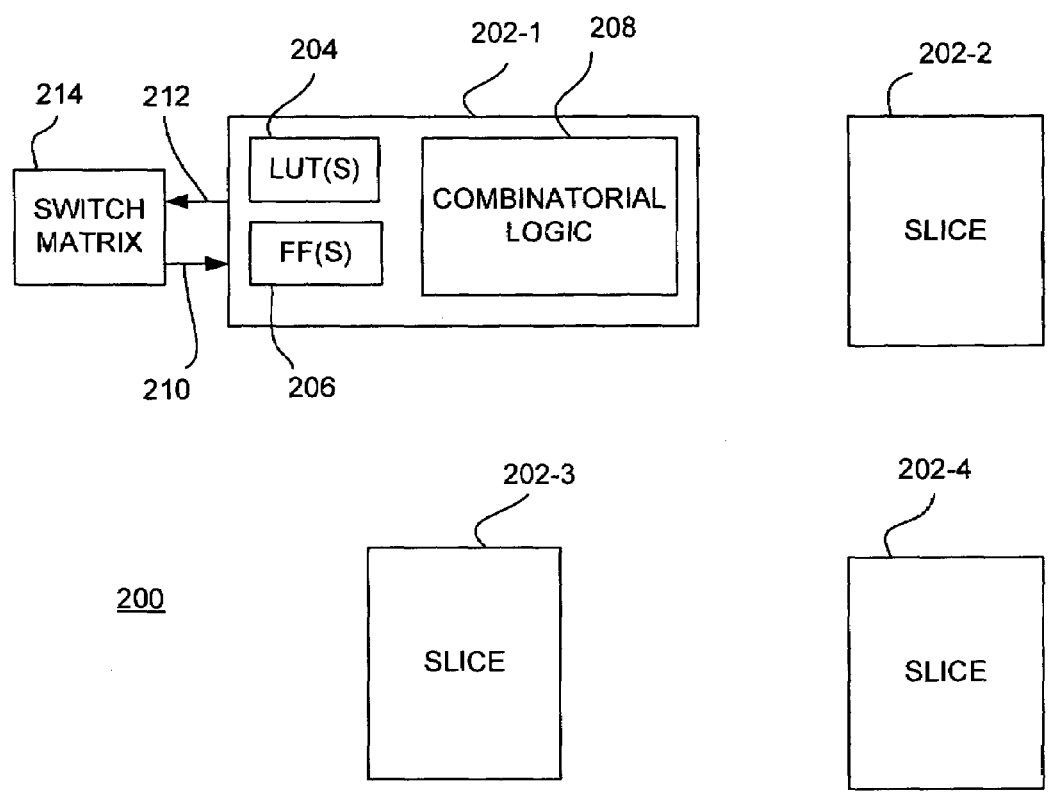
FIG. 2 is a block diagram depicting an exemplary embodiment of a configurable logic block (CLB) in the FPGA of FIG. 1.

FIG. 2 is a block diagram depicting an exemplary embodiment of a CLB 200. The CLB 200 illustratively includes slices 202-1 through 202-4 (collectively referred to as slices 202). Each of the slices 202 includes the same or similar logic so only the slice 202-1 is shown in more detail. The slice 202-1 includes one or more LUTs 204, one or more flip-flops (FFs) 206, and combinatorial logic 208. The combinatorial logic 208 includes multiplexers, logic gates, and the like known in the art. The slice 202-1 includes various input pins 210 and output pins 212. Some of the input pins 210 and/or output pins 212 are coupled to a switch matrix 214 of the programmable interconnect 111. Notably, the LUT(s) 204, combinatorial logic 208, and/or the FFs 206 may be configured such that one or more signals on the input pins 210 pass through to one or more output pins 212. Thus, a slice may be used as an interface macro between two circuit modules, as described below. For purposes of clarity, the CLB 200 is shown in a simplified form. For further details regarding an exemplary slice configuration in a CLB, the reader is referred to pages 163-185 of the "VIRTEX-4 User Guide", Version 1.5, Mar. 21, 2006, published by Xilinx, Inc., which pages are hereby incorporated herein by reference.

Figure 3:
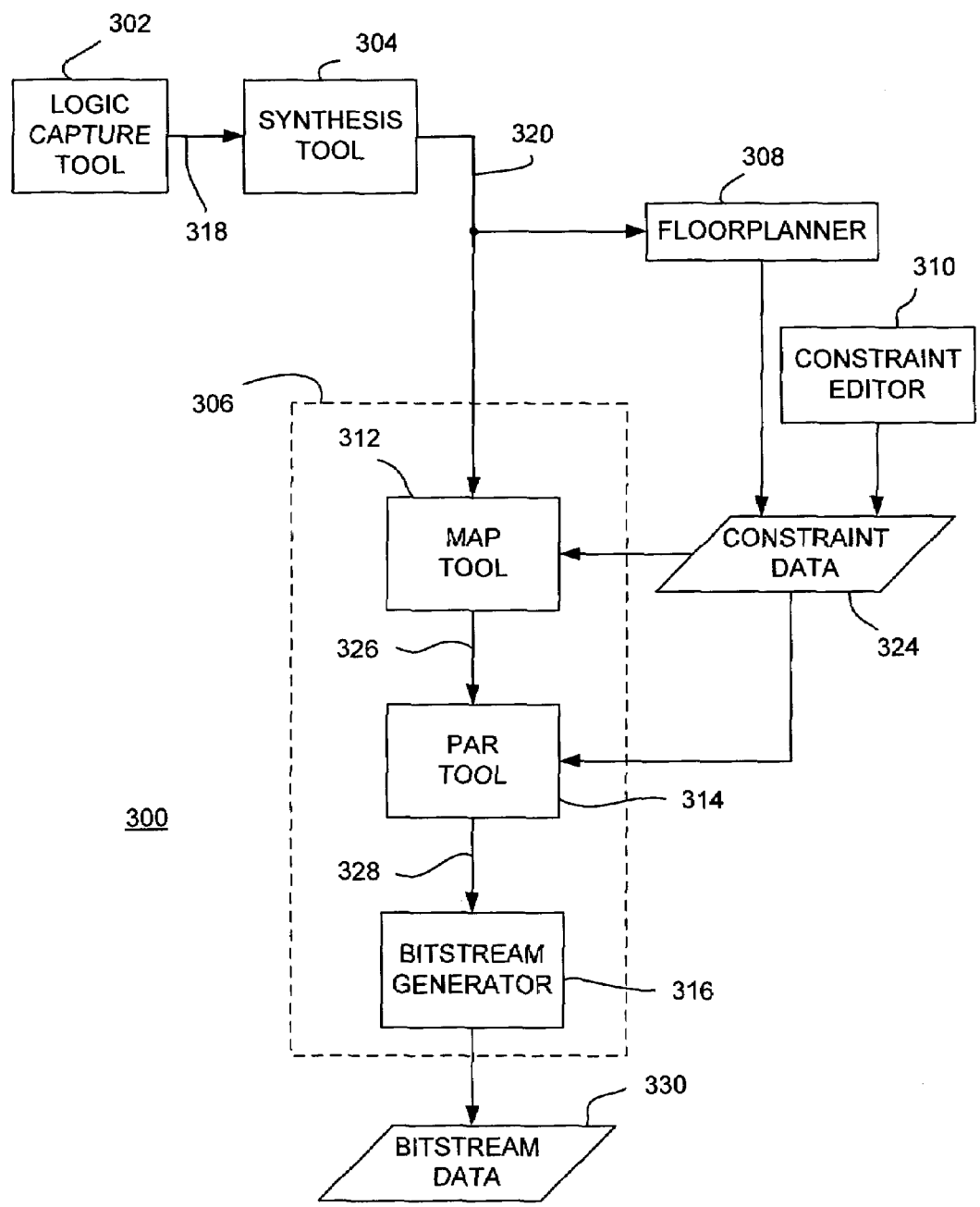
FIG. 3 is a block diagram depicting an exemplary embodiment of a logic design system for a programmable logic device (PLD) in accordance with one or more aspects of the invention.

FIG. 3 is a block diagram depicting an exemplary embodiment of a logic design system 300 for a programmable logic device (PLD) in accordance with one or more aspects of the invention. The system 300 includes a logic capture tool 302, a synthesis tool 304, a floorplanner 308, a constraint editor 310, and an implementation tool 306. In the present embodiment, the system 300 is configured to implement a logic design using a target FPGA. Accordingly, the implementation tool 306 includes a map tool 312, a place-and-route (PAR) tool 314, and a bitstream generator 316. The system 300 may be implemented using the computer 600 of FIG. 6 and described below. Notably, the tools may be part of one or more software programs stored in a memory and configured for execution by a central processing unit (CPU).

One or more aspects of the invention relate to creating dynamically reconfigurable modules for use in an FPGA ("modular design"). In particular, the logic design is divided into a top-level design having modules. Each of the modules is either a static module or a reconfigurable module. A reconfigurable module is capable of partial dynamic active reconfiguration when the target FPGA is active via a partial reconfiguration process. Once the target FPGA is active, a static module is fixed and cannot be reconfigured. In one embodiment, a single slice interface macro is provided to provide an interface to reconfigurable modules. For a modular design, the logic design system 300 is used to separately implement the modules and then the top-level design, as described more fully below. For purposes of clarity by example, the logic design system 300 is described immediately below with respect to a logic design in general. Features of the design system 300 specifically pertaining to modular design are described along with FIGS. 4-5.

In particular, the logic capture tool 302 is configured to capture a circuit design from a user and generate a behavioral description 318 of the circuit design. The behavioral description 318 includes a plurality of circuit components, such as flip-flops, memories, LUTs, and the like, connected together via signal conductors (nets). The logic capture tool 302 may include a graphic interface through which a designer connects symbols and blocks representing various components to produce a schematic description of the circuit design. The logic capture tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 304 is configured to receive the behavioral description 318. The synthesis tool 304 processes the behavioral description 318 to produce a logical description 320 of the circuit design. The logical description 320 includes a logical network list ("netlist") of lower-level circuit elements and logic gates, as well as connections (nets) between inputs and outputs thereof, in terms of the hierarchy specified in the behavioral description 318. For example, the logical description 320 may be compliant with the Electronic Design Interchange Format (EDIF). The synthesis tool 304 may also generate constraint data associated with the logical description 320 that includes various timing and layout constraints. Alternatively, the logical description 320 may be annotated with constraint data. Such an annotated netlist is produced by XST synthesis tool, commercially available by Xilinx, Inc., of San Jose, Calif.

The floorplanner 308 is configured to receive the logical description 320. The floorplanner 308 may comprise a graphical tool that gives a designer control over location of circuit components of a logic design in the target FPGA. In one embodiment, the floorplanner 308 displays a hierarchical representation of the logic design in a window of a graphic interface using hierarchy structure lines and colors to distinguish the different hierarchical levels. The window displays the floorplan of the target FPGA and allows the designer to draw rectangles into which the designer places logic from the hierarchy. The floorplanner 308 generates various constraints that are provided as part of constraint data 324. Such constraints include positions and ranges of logic blocks. A designer may use the constraint editor 310 to add various constraints to the constraint data 324, such as PERIOD constraints (i.e., the time between rising edges of a clock signal) for all clocks, as well as input/output (IO) timing constraints (time between two pins, typically measured from a clock input at a first pin and data out at a second pin) for IOs.

The map tool 312 is configured to receive the logical description 320 and the constraint data 324. The map tool 312 maps the logical description 320 onto physical resources within the target FPGA (i.e., the circuit components, logic gates, and signals are mapped onto LUTs, flip-flops, clock buffers, I/O pads, and the like of the target FPGA). The map tool 312 produces a mapped circuit description 326 in accordance with any constraints in the constraint data 324. The mapped circuit description 326 includes groupings of the physical resources of the target FPGA expressed in terms of CLBs and IOBs that include these resources. The mapped circuit description 326 does not include physical location information.

The PAR tool 314 is configured to receive the mapped circuit description 326 and the constraint data 324. The PAR tool 314 determines placement for the physical resource groupings of the mapped circuit description 326 in the target FPGA and apportions the appropriate routing resources. The PAR tool 314 performs such placement and routing in accordance with any constraints in the constraint data 324. The PAR tool 314 produces physical design data 328. The bitstream generator 316 is configured to receive the physical design data 328 and produce bitstream data 330 for the target FPGA.

Figure 4:
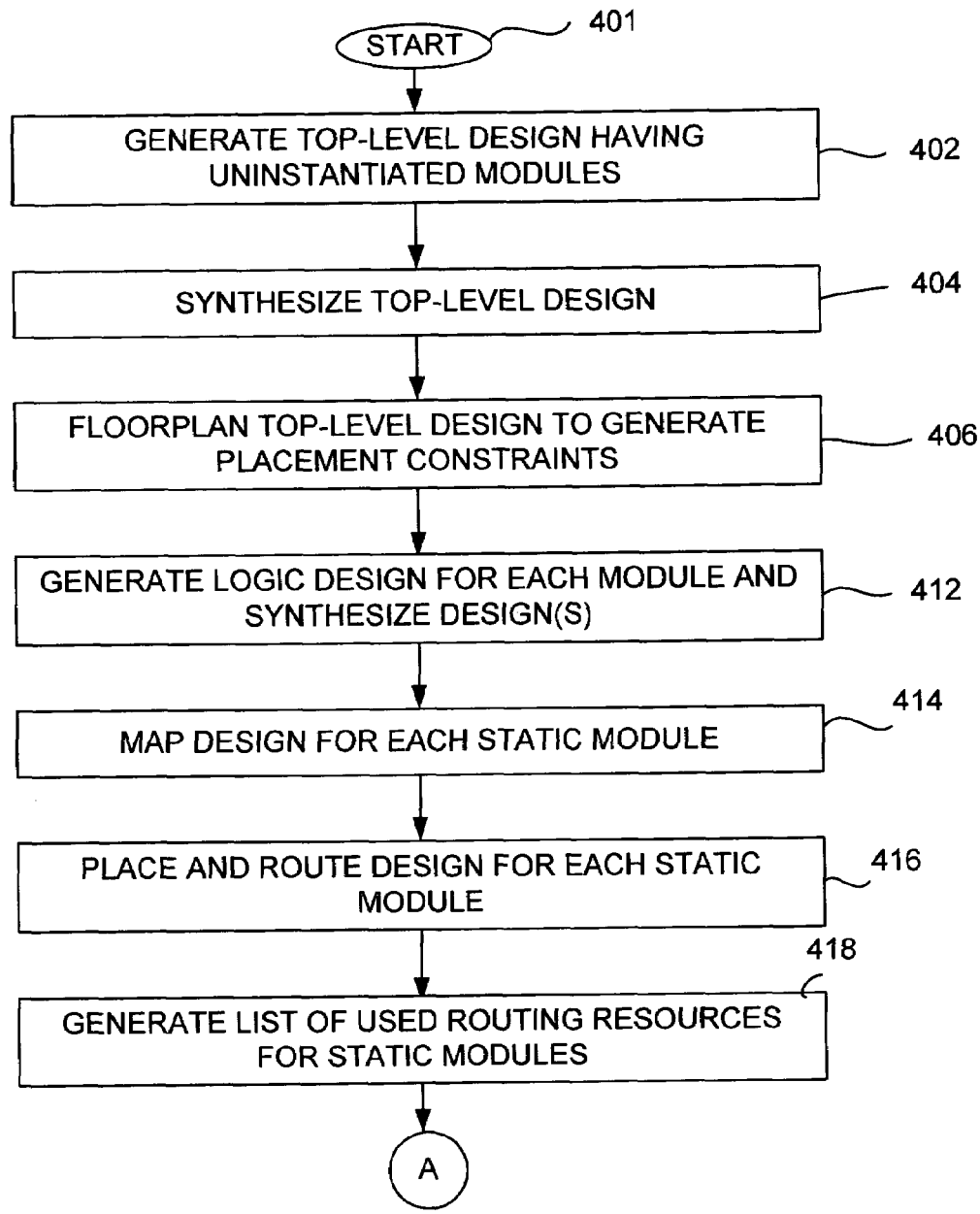
FIGS. 4-5 depict a flow diagram of an exemplary embodiment of a method for modular design in accordance with one or more aspects of the invention.
Figure 5:
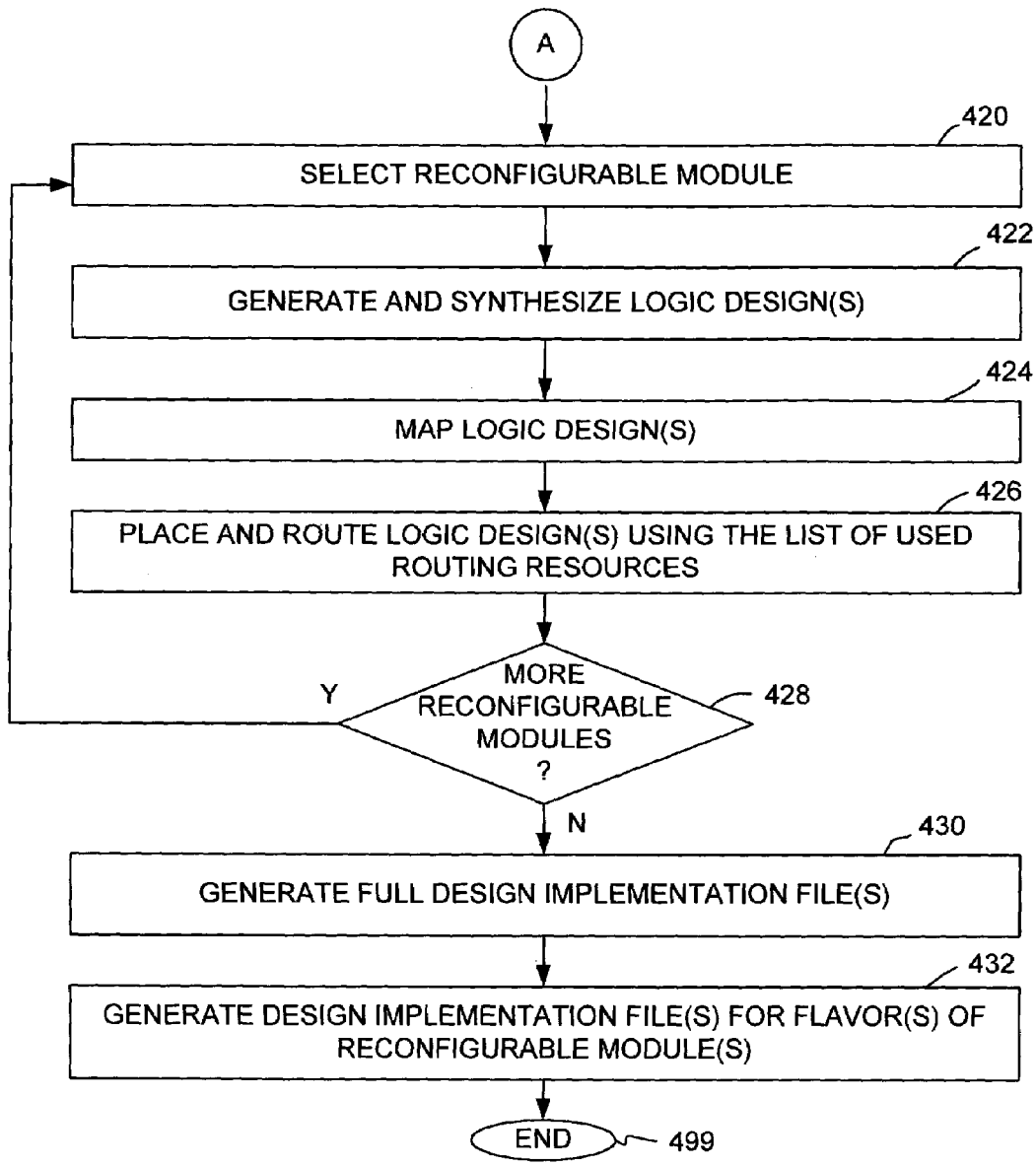

FIGS. 4-5 depict a flow diagram of an exemplary embodiment of a method 400 for modular design in accordance with one or more aspects of the invention. The method 400 begins at step 401. At step 402, a top-level design is captured using the logic capture tool 302. At step 404, the top-level design is synthesized using the synthesis tool 304. At step 406, the top-level design is floorplanned to place logic interface macros and generate placement constraints. The floorplan may be generated using the floorplanner 308 or generated manually by a designer. The placement constraints are part of the constraint data for the top-level design, which may include other constraints, such as timing constraints. Steps 402 through 406 are referred to as the "initial budgeting phase." In particular, the top-level design includes a plurality of un-instantiated modules, a signal interface for each module, global resources and signals (e.g., IOB resources, clock signals), and one or more logic interface macros. Each un-instantiated module includes a defined signal interface and may be configured as either a static module or a reconfigurable module. The signal interface of each module may include one or more ports and signals associated with the ports.

For a static module, the signal interface is unrestricted in that all signals connecting to/from a static module are connected directly to the ports of the module. A static module may interface with IOBs. In accordance with one aspect of the invention, defining an implementation area within the floorplan is optional for each static module. By not constraining the area of a static module, complexity of the design layout is reduced. For example, the designer is not required to explicitly lock a static module into an arbitrary rectangular area, which may otherwise cause sub-optimal logic placement. However, a static module cannot overlap an implementation area of any reconfigurable module. As discussed below, a static module will have a single physical implementation.

For a reconfigurable module, the signal interface is restricted in that each signal connecting to/from the reconfigurable module other than a clock signal is connected to a pin (i.e., logical connection) on a logic interface macro. Signals that are to be connected to IOBs must be connected to a pin of a logic interface macro, which is then connected to the IOB in the top level design. Each reconfigurable module defines a single rectangular implementation area in the floorplan. A reconfigurable module will have multiple "implementation flavors", as discussed below.

In one embodiment, a logic interface macro includes a CLB slice. The single slice interface macro may be placed anywhere within a reconfigurable module implementation area. Notably, all of the pins of the logic interface macro may fall inside of a reconfigurable module implementation area. All ports of a reconfigurable module must connect only with pins on one or more logic interface macros. All signals to and from a reconfigurable model must connect to the appropriate pins on the logic interface macros. The CLB slice defines a routing path between two implementation areas, which guarantees that the routing interface between static and dynamic regions is fixed.

The use of logic interface macros, as opposed to conventional three-state buffer (tbuf) macros, significantly increases the number of interface signals available to a given reconfigurable module (i.e., tbufs are often a scarce resource in an FPGA). Other types of logic interface macros having multiple CLB slices are placed along the boundary of the reconfigurable module (e.g., one slice within the reconfigurable module and one slice outside the reconfigurable module). Use of tbufs and/or multiple slice macros limits placement options and limits the number of such macros that may be used. The single slice macro can be placed anywhere within the boundary of the reconfigurable module, which allows the use of more logic interface macros and more optimal placement of such macros.

In accordance with one aspect of the invention, the defined area for a reconfigurable module need not include all logic cells (CLBs, IOBs, etc.) in the full height of a column in the target device. Logic cells above and below any reconfigurable module implementation area may be used by static modules of the design. Use of such logic cells can enhance the operation characteristics of any design through minimization of critical net routing delays.

Figure 7:
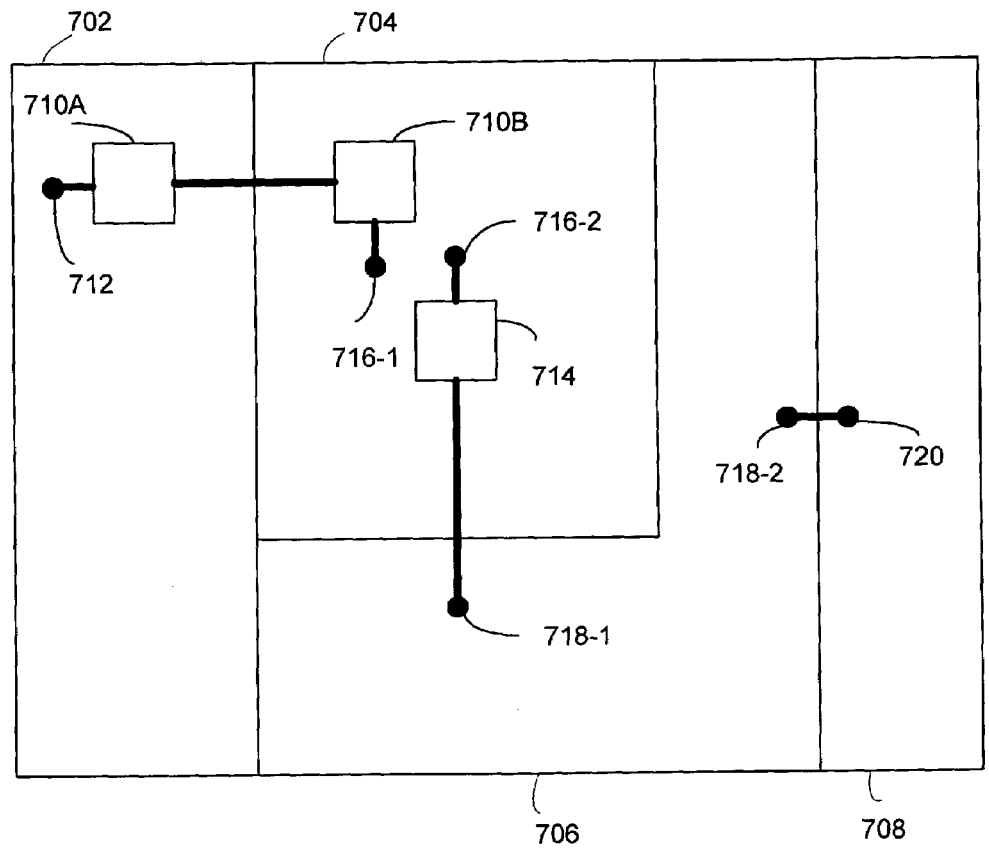
FIG. 7 is a block diagram depicting an exemplary top-level floorplan in accordance with one or more aspects of the invention.

FIG. 7 is a block diagram depicting an exemplary top-level floorplan 700 in accordance with one or more aspects of the invention. The top-level floorplan 700 illustratively includes a reconfigurable module 702, a reconfigurable module 704, a static module 706, and a static module 708. The reconfigurable module 702 includes a signal interface defined by the port 712. The reconfigurable module 702 includes a signal interface defined by the ports 716-1 and 716-2. The static module 706 includes a signal interface defined by the ports 718-1 and 718-2. The static module 708 includes a signal interface defined by the port 720.

The reconfigurable module 702 extends the full height of the device and is configured for communication with the reconfigurable module 704 via a pair logic interface macros 710A and 710B. Each of the logic interface macros 710A and 710B illustratively comprise a single CLB slice coupled to the ports 712 and 716-1, respectively. The reconfigurable module 704 does not extend the full height of the device. The area below the reconfigurable module 704 is used by the static module 706. The reconfigurable module 704 is configured for communication with the static module 706 via a logic interface macro 714. The logic interface macro 714 illustratively comprises a single CLB slice coupled to the ports 716-2 and 718-1. The static module 708 extends the full height of the device and is configured for direct communication with the static module 706 between the ports 718-2 and 720.

Returning to FIGS. 4-5, after the initial budgeting phase, the method 400 proceeds to the active module phase, where the un-instantiated modules in the top-level design are physically implemented. At step 412, a logic design for each static module and each reconfigurable module is generated and synthesized using the logic capture tool 302 and the synthesis tool 304, respectively. At step 414, the logic design for each static module is mapped onto physical resources in the target FPGA using the map tool 312 in accordance with the constraint data of the top-level design and any constraint data for the module design. At step 416, the logic design for each static module is placed and routed using the PAR tool 314 in accordance with the constraint data of the top-level design and any constraint data for the module design. Notably, since some or all of the logic interface macros are entirely located in a reconfigurable implementation area, the PAR tool 314 may route some signals for a static module into a reconfigurable implementation area. That is, routing resources in a reconfigurable implementation area are used to route signals for the static module.

At step 418, a list of used routing resources is generated for static module(s) using routing resources in reconfigurable implementation area(s). Notably, if a static module includes routing resources in a reconfigurable implementation area, the static design implementation must be "aware" of any reconfigurable design implementation and vice versa. Since the static design and dynamic design both may utilize resources in the dynamic areas, each must be aware of the other so that they do not create shorts (i.e., utilize the same routing resources) in the dynamic area. The awareness is achieved through the list of used routing resources.

At step 420, a reconfigurable module is selected. Each design for the selected reconfigurable module is referred to as a "flavor" for the module. At step 424, each logic design is mapped onto physical resources in the target FPGA using the map tool 312 in accordance with the constraint data of the top-level design and any constraint data for the module design. At step 426, each logic design is placed and routed using the PAR tool 314 in accordance with the constraint data of the top-level design, any constraint data for the module design, and the list of used routing resources created at step 418. Notably, the PAR tool 314 uses the list of used routing resources to prohibit the implementation of any reconfigurable module flavor from using any of the routing resources specified in the list. At step 428, a determination is made whether the top-level design includes more reconfigurable modules. If so, the method 400 returns to step 420 and repeats. Otherwise, the method 400 proceeds to step 430.

After the active module phase, the method 400 proceeds to the final assembly phase, where physical implementations of the modules are combined to produce a complete physical design. At step 430, at least one full design implementation file is generated by combining the static modules with various flavors of the reconfigurable modules. For example, if a design has two static modules (S1, S2) and two reconfigurable modules, each of which has two flavors (R1.1, R1.2, R2.1, and R2.2), then there are four possible full design implementations:

a) both S1 and S2 with R1.1 and R2.1;
b) both S1 and S2 with R1.1 and R2.2;
c) both S1 and S2 with R1.2 and R2.1; and
d) both S1 and S2 with R1.2 and R2.2.

One or more of these full design implementations may be produced at step 430. In particular, a full design implementation file may be produced by mapping, placing, routing, and generating a bitstream for the top-level design and the modules using the map tool 312, the PAR tool 314, and the bitstream generator 316. The implementations for the modules in the active implementation phase are preserved. The resultant bitstream(s) are full device programming files.

At step 432, a single design implementation file is produced for at least one flavor of at least one reconfigurable module. These design implementations differ from those generated during the active implementation phase in that all of the resources from the static modules are included. In the above example, four implementation files are generated:

a) implementation file for flavor 1 of reconfigurable module 1 with S1 and S2;

b) implementation file for flavor 2 of reconfigurable module 1 with S1 and S2;

c) implementation file for flavor 1 of reconfigurable module 2 with S1 and S2; and d) implementation file for flavor 2 of reconfigurable module 2 with S1 and S2.

One or more of these partial design implementations may be produced at step 432. The partial design implementations are produced by mapping, placing, routing, and generating a bitstream for the top-level design and the modules using the map tool 312, the PAR tool 314, and the bitstream generator 316. The implementations for the modules in the active implementation phase are preserved. The resultant bitstream(s) are partial device programming files and can only be used to reconfigure or dynamically change the functional behavior of a given reconfigurable module to the associated module flavor. This reconfiguration of a given reconfigurable module can take place while the rest of the device, as defined in the static modules and the reconfigurable modules not being updated, continue to operate in a glitchless manner. The method 400 ends at step 499. By "glitchless" it is meant that executing logic in the static modules and the reconfigurable modules not being updated will by unaffected by the programming of values into memory cells during dynamic reconfiguration.

In the above embodiment, the static design and the dynamic design are merged together to generate a single bit stream that can be programmed into the device without considering what the bitstream is programming over. It is possible, in some devices, to dynamically read back what is currently programmed in the configuration frames and to "add" to the programming to the existing programming. Utilizing this method of programming removes the requirement that the static and dynamic designs be merged together in order to generate a bitstream, but requires extra programming support.

Figure 6:
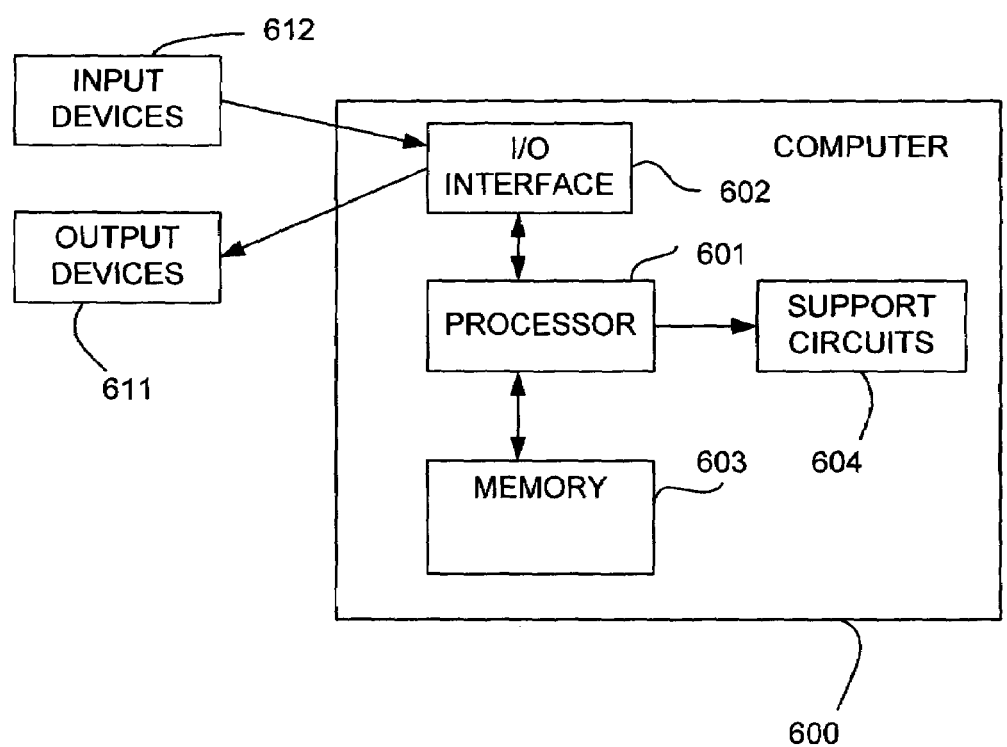
FIG. 6 is a block diagram depicting an exemplary embodiment of a computer suitable for implementing the processes and methods described herein.

FIG. 6 is a block diagram depicting an exemplary embodiment of a computer 600 suitable for implementing the processes and methods described herein. For example, the computer 600 may be used to implement the system 300 of FIG. 3, as well as the method 400 of FIGS. 4-5. The computer 600 includes a processor 601, a memory 603, various support circuits 604, and an I/O interface 602. The processor 601 may be any type of microprocessor known in the art. The support circuits 604 for the processor 601 include conventional cache, power supplies, clock circuits, data registers, I/O interfaces, and the like. The I/O interface 602 may be directly coupled to the memory 603 or coupled through the processor 601. The I/O interface 602 may be coupled to various input devices 612 and output devices 611, such as a conventional keyboard, mouse, printer, display, and the like.

The memory 603 stores all or portions of one or more programs and/or data to implement the system 300 and the method 400 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 600 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 603. The memory 603 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of modular circuit design for a programmable logic device (PLD), comprising:
    defining a static module and a reconfigurable module;
    defining at least one logic interface macro within an implementation area of the reconfigurable module;
    implementing the static module using at least one routing resource in the implementation area of the reconfigurable module coupled to the at least one logic interface macro;
    recording the at least one routing resource in a list of used routing resources; and
    implementing the reconfigurable module using the list of used routing resources.

2. The method of claim 1, wherein each of the at least one logic interface macro comprises programmable logic of the PLD.

3. The method of claim 2, wherein each of the at least one logic interface macro comprises a slice of a configurable logic block (CLB).

4. The method of claim 1, wherein the step of implementing the static module comprises:
    mapping the static module onto physical resources in the PLD; and
    placing and routing the static module as mapped.

5. The method of claim 4, wherein the step of implementing the reconfigurable module comprises:
    mapping the reconfigurable module onto physical resources in the PLD; and
    placing and routing the reconfigurable module as mapped using routing resources other than those in the list of used routing resources.

6. The method of claim 1, further comprising:
    generating at least one full design implementation file; and
    generating at least one design implementation file for at least one flavor of the reconfigurable module.

7. The method of claim 6, wherein each of the at least one full design implementation file comprises the static module as implemented and a flavor of the reconfigurable module as implemented.

8. A system for modular circuit design for a programmable logic device (PLD), comprising:
- a logic capture tool for capturing a circuit design including at least one static module and at least one reconfigurable module;
- a floorplan tool for positioning the at least one static module and the at least one reconfigurable module and positioning one or more logic interface macros within an implementation area of the at least one reconfigurable module on a floorplan; and
- an implementation tool for implementing the at least one static module using at least one routing resource in the implementation area of the at least one reconfigurable module coupled to the at least one logic interface macro, recording the at least one routing resource in a list of used routing resources, and implementing the at least one reconfigurable module using the list of used routing resources.

9. The system of claim 8, wherein each of the at least one logic interface macro comprises a slice of a configurable logic block (CLB).

10. The system of claim 8, wherein the signal interface of the static module is coupled to the first pins of each of the at least one logic interface macro using at least one routing resource in the implementation area of the at least one reconfigurable module.

11. A computer readable medium having stored thereon software to be executed by a computer for modular circuit design for a programmable logic device (PLD), comprising:
- code for defining a static module and a reconfigurable module;
- code for defining at least one logic interface macro within an implementation area of the reconfigurable module;
- code for implementing the static module using at least one routing resource in the implementation area of the reconfigurable module coupled to the at least one logic interface macro;
- code for recording the at least one routing resource in a list of used routing resources; and
- code for implementing the reconfigurable module using the list of used routing resources.

12. The computer readable medium of claim 11, wherein each of the at least one logic interface macro comprises programmable logic of the PLD.

13. The computer readable medium of claim 12, wherein each of the at least one logic interface macro comprises a slice of a configurable logic block (CLB).

14. The computer readable medium of claim 11, wherein the code for implementing the static module comprises:
- code for mapping the static module onto physical resources in the PLD; and
- code for placing and routing the static module as mapped.

15. The computer readable medium of claim 14, wherein the code for implementing the reconfigurable module comprises:
- code for mapping the reconfigurable module onto physical resources in the PLD; and
- code for placing and routing the reconfigurable module as mapped using routing resources other than those in the list of used routing resources.

16. The computer readable medium of claim 11, further comprising:
- code for generating at least one full design implementation file; and
- code for generating at least one design implementation file for at least one flavor of the reconfigurable module.

17. The computer readable medium of claim 16, wherein each of the at least one full design implementation file comprises the static module as implemented and a flavor of the reconfigurable module as implemented.

* * * * *